United States Patent [19]

DiBiase et al.

[11] Patent Number: 5,019,792
[45] Date of Patent: May 28, 1991

[54] SIGNAL TRACKING ELECTRONICALLY TUNABLE FILTER

[75] Inventors: Robert DiBiase, Carlisle; Zvi Galani, Bedford; Raymond C. Waterman, Jr., Westford, all of Mass.

[73] Assignee: Raytheon Company, Lexington, Mass.

[21] Appl. No.: 425,144

[22] Filed: Oct. 23, 1989

[51] Int. Cl.$^5$ ............................................ H03H 11/00
[52] U.S. Cl. ..................................... 333/17.1; 333/207
[58] Field of Search ....................... 333/17.1, 205, 207, 333/209

[56] References Cited

U.S. PATENT DOCUMENTS

| | | | |
|---|---|---|---|
| 3,667,052 | 5/1972 | Effenberger | 333/17.1 X |
| 3,668,566 | 6/1972 | Trigg | 333/17.1 |
| 3,715,690 | 2/1973 | Young et al. | 333/17.1 |
| 3,936,830 | 2/1976 | Overburg | 333/17.1 X |
| 4,426,630 | 1/1984 | Folkman | 333/17.1 X |

Primary Examiner—Paul Gensler
Attorney, Agent, or Firm—Donald F. Mofford; Richard M. Sharkansky

[57] ABSTRACT

A tunable bandpass filter for radio frequency energy with a phase-locked loop for tracking an input signal and to control the filter to keep the center frequency of the passband coincident with the frequency of the input signal is shown. Using a Yttrium Iron Garnet (YIG) filter as a frequency determining element and as a passive dispersive reference element for a frequency discriminator, the bandpass filter uses the output signal of the discriminator to form a fine tuning signal to control the center frequency of the passband of the YIG filter.

9 Claims, 1 Drawing Sheet

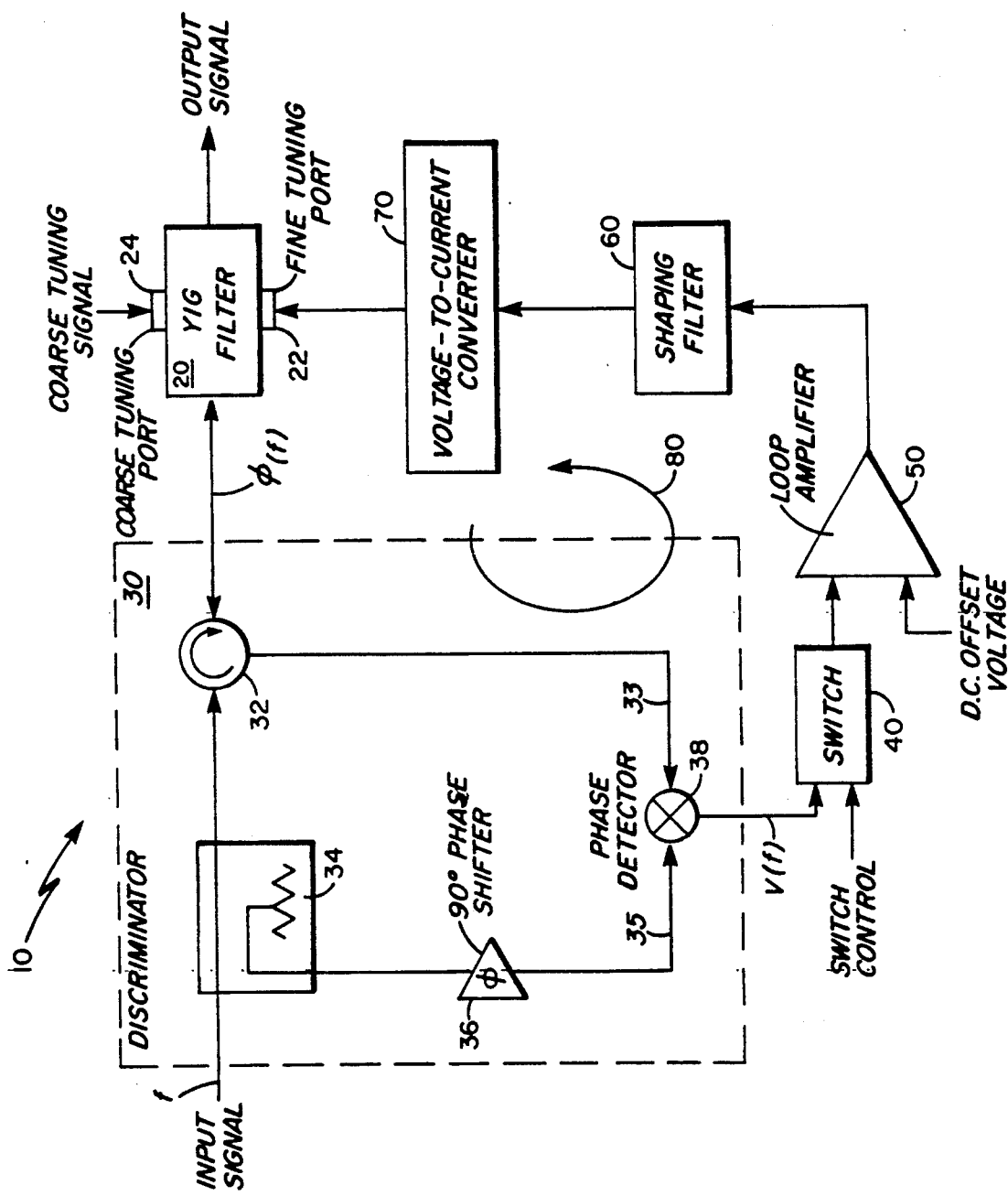

SIGNAL TRACKING ELECTRONICALLY TUNABLE FILTER

BACKGROUND OF THE INVENTION

This invention pertains generally to tunable bandpass filters for radio frequency energy, and particularly to a tunable microwave bandpass filter having a passband of frequencies wherein a frequency-locked loop is used to track an input signal and to control the filter to keep the center frequency of the passband coincident with the frequency of the input signal.

Filters employing YIG spheres are used extensively as electronically tunable microwave bandpass filters because such filters offer narrow bandwidth, low insertion loss and a wide frequency tuning range. In typical applications of such filters, the following characteristics of the passband of the filter used are necessary: (a) accurate positioning relative to the frequency of an input signal; (b) stability over a period of time and during changes of environmental conditions; and (c) a highest possible frequency slewing rate.

One of the major problems associated with YIG filters is the drift of the center frequency of the passband due to changing temperature. Such drift is caused primarily by the magnetic circuit associated with the YIG filter; more specifically, by changes of dimensions of the mechanical configuration of the electromagnet used in any known YIG filter. A known technique for reducing drift in YIG filters is to arrange for the resonant frequency of the YIG sphere to be dependent on temperature by changing the relative position of the YIG sphere in the magnetic field. By rotating the YIG sphere, the effect of changing temperature can be minimized. Although this reduces the amount of drift, the drift of the center frequency of the passband may still be appreciable.

If a YIG filter only requires a limited tuning range, then a permanent magnet can be used together with the electromagnet. In such a filter, stabilization is improved by placing a ferrite sleeve around the permanent magnet to provide a temperature-dependent shunt to the magnetic field. While such technique reduces the drift of the center frequency of the passband, a satisfactory degree of stabilization is difficult to achieve without following an extensive procedure for alignment of the elements in the YIG filter. Consequently, the cost of YIG filters may be increased substantially.

The above-mentioned techniques are effective only after all parts of the YIG filter have reached a uniform temperature. Changes in ambient temperature cause temperature gradients to be engendered inside the YIG filter, such gradients depending upon the rate at which the ambient temperature is changing. A rapid change in ambient temperature causes any of the above techniques to be ineffective.

A second major problem associated with YIG filters is the drift of the center frequency of the passband due to the effects of microphonism. YIG filters are often used in environments wherein mechanical vibrations are experienced. In such environments the center frequency of the passband of any known YIG filter will vary because mechanical vibrations result in different displacements of the YIG sphere and the elements that produce the magnetic field within the YIG filter. As a result, then, the relationship between the YIG sphere and the magnetic field within the YIG filter changes, the ultimate effect then being an unwanted change in the center frequency of the passband of the YIG filter.

SUMMARY OF THE INVENTION

With the foregoing background of this invention in mind, it is a primary object of this invention to provide a tunable bandpass filter, the contemplated filter being adapted to keep the center frequency of the passband coincident with the frequency of the input signal.

Another object of this invention is to provide a tunable bandpass filter, eliminating the need for complicated stabilization techniques and thereby reducing the cost of the filter.

Still another object of this invention is to provide a tunable bandpass filter adapted to reduce the effects of microphonism.

Still another object of this invention is to provide a tunable bandpass filter that substantially eliminates the hysteresis effects present in tuning characteristics of YIG filters.

A still further object of this invention is to provide a tunable bandpass filter having a reduced frequency settling time, thereby enhancing the frequency slewing rate of the filter.

The foregoing and other objects of this invention are met generally by a tunable bandpass filter having a YIG filter serving both as a control element for controlling the range of the passband of frequencies in the filter and as a passive dispersive reference element of an interferometer type of frequency discriminator in a frequency-locked loop, the output signal of the discriminator being fed back to the fine tuning port of the YIG filter to keep the center frequency of the passband of the YIG filter coincident with the frequency of the input signal.

BRIEF DESCRIPTION OF THE DRAWING

For a more complete understanding of the invention, reference is now made to the following description of the accompanying drawing, in which the single FIGURE is a simplified block diagram of a tunable bandpass filter according to this invention.

DESCRIPTION OF THE PREFERRED EMBODIMENT

Referring now to the single FIGURE, it may be seen that a tunable bandpass filter 10 according to this invention here includes a YIG filter 20, a discriminator 30 comprising a circulator 32, a directional coupler 34, a 90° phase shifter 36 and a phase detector 38, a switch 40, a loop amplifier 50, a shaping filter 60 and a voltage-to-current converter 70. The foregoing elements form a frequency-lock loop 80 for controlling the center frequency of the passband of the YIG filter 20 by locking the center frequency of the passband to an input signal applied to an input of the tunable bandpass filter 10.

The input signal which may, for example, be taken from an amplifier (not shown) is applied to the input of tunable bandpass filter 10, is passed through a directional coupler 34 and then through a circulator 32 to be applied to an input port of YIG filter 20. YIG filter 20 may be any known YIG filter such as that made in accordance with the teachings of U.S. Pat. No. 4,758,800, issued July 19, 1988, entitled "Low Noise Magnetically Tuned Resonant Circuit" (which patent is assigned to the same assignee as this application and is incorporated herein by reference).

In order to achieve proper operation, the signal applied to the input port (not numbered) of YIG filter 20 must be overcoupled. The desired overcoupling may be accomplished by adjusting the position of the input coupling loop (not shown) of the YIG filter 20 to provide a transfer function of the discriminator 30 in the form of a conventional S-shaped discriminator curve. The slope of such discriminator curve is controlled by the degree of coupling at the input port (not numbered) of YIG filter 20. The discriminator 30 has a main arm 33 and a reference arm 35 connected, as shown, to two input ports of a phase detector 38. Radio frequency (R.F.) energy reflected from the YIG filter 20 is fed, via the circulator 32 and the main arm 33, to one of the ports of the phase detector 38. A portion of the input signal to the YIG filter 20 is coupled, via a 90° phase shifter 36 and the reference arm 35, to the other port of the phase detector 38, thereby providing a reference signal to the phase detector 38. The 90° phase shifter 36 provides a quadrature phase relationship between the reference signal and the R.F. energy reflected from the YIG filter 20 at the two input ports of the phase detector 38. The output signal of phase detector 38 is passed through a switch 40 to be applied to loop amplifier 50 wherein such signal is amplified. The signal out of loop amplifier 50 is first filtered in a shaping filter 60, is then converted in a voltage-to-current converter 70 to a corresponding current and is finally applied to fine tuning port 22 of YIG filter 20. The current applied to the fine tuning port 22 is passed, along with a current designated "COARSE TUNING SIGNAL," to the coils of an electromagnet (not shown) in the YIG filter 20.

It will be appreciated the foregoing elements form a frequency-lock loop 80 to cause the center frequency of the passband of the YIG filter 20 to be locked to the frequency of any input signal applied to the input of the tunable bandpass filter 10. If the center frequency of such passband varies for any reason, then the output, $V_{(f)}$, of the phase detector 38 changes, ultimately to cause the current applied to fine tuning port 22 to change so that the effect of the disturbance is nulled.

In a typical application of the tunable bandpass filter 10, switch 40 is opened and a predetermined coarse tuning signal is applied to coarse tuning port 24, to set the center frequency of the passband of the YIG filter 20 to a frequency approximating a desired frequency. The switch 40 is closed to complete the frequency-lock loop 80 and the action of the loop 80 causes the center frequency of the passband of the YIG filter 20 to lock to the frequency of the input signal. Thereafter, any drift in the frequency of the input signal or in the center frequency of the passband of the YIG filter 20 causes an appropriate fine tuning signal (the magnitude of such signal being representative of the amount of drift and the polarity of such signal being representative of the direction of drift) to be generated so that the center frequency of the passband of the YIG filter 20 is locked to the frequency of the input signal.

The relationship between the voltage of the output signal, V(f), of the discriminator 30 and the frequency of the input signal, f, is given by: $V(f) = K \sin \phi(f)$, where K is a constant related to the input levels of power of the main and reference arms of the discriminator 30 and $\phi(f)$ is the reflection phase response of the input port of the YIG filter. In order for the discriminator to exhibit the "S" shaped relationship between the output voltage, V(f), and the input signal with a frequency, f, the following conditions must be satisfied: (a) the output voltage must equal zero when the frequency of the input signal is equal to the center frequency (fo) of the passband (V(of)=0 volts); (b) the reflection phase response of the input port of the YIG filter 20 must exhibit odd symmetry about the frequency, fo; and (c) the polarity (positive or negative) of the slope of the "S" curve at of cannot repeat at any other frequency. As described hereinabove, when the YIG filter 20 is operated in a reflection mode, meaning in an overcoupled condition at the input port, the above stated conditions are met so that $\phi(\text{fo}) = 0°$, which yields a reflection phase response $\phi(f)$ that is bounded by $-180° < \phi(f) + 180°$. Such an overcoupled condition and the corresponding reflection phase response can be maintained over a wide range of tuning frequencies. It will be appreciated that the passband of a filter with an input port having an overcoupled signal is not as flat as that of a filter tuned for maximum flatness; however, passband flatness is not required because the action of the loop 80 forces the center frequency of the passband to coincide with the frequency of the input signal.

Having described this invention, it will now be apparent to one of skill in the art that numerous variations may become apparent. For example, the YIG filter 20 could be replaced with any type of electronically tunable filter. In addition, it will be evident that the described circuitry could be modified to eliminate the circulator and to add a second directional coupler at the output of the YIG filter so that the requisite inputs to the phase detector could be attained. In this case the YIG filter performs in the transmission mode. It is felt, therefore, that this invention should not be restricted to its disclosed embodiment, but rather should be limited only by the spirit and scope of the appended claims.

What is claimed is:

1. A bandpass filter for radio frequency (R.F.) signals comprising:
   (a) a Yttrium Iron Garnet (YIG) filter responsive to a coarse tuning signal and a fine tuning signal and having a passband with a center frequency;
   (b) means for producing a first R.F. signal reflected from the YIG filter indicative of the center frequency of the passband of the YIG filter;
   (c) means, responsive to an applied R.F. signal and to the first R.F. signal, for forming a control signal comprising:
      (i) means for shifting the phase of a portion of the applied R.F. signal for forming a reference signal having a quadrature phase relationship with the first R.F. signal; and
      (ii) a phase detector, responsive to the reference signal and the first R.F. signal, to provide the control signal;
   (d) means for converting the control signal to the fine tuning signal with an amplitude and a polarity indicative of the difference between the frequency of the applied R.F. signal and the center frequency of the passband of the YIG filter; and
   (e) means for precluding the fine tuning signal from controlling the frequency of the center frequency of the passband of the YIG filter whenever the YIG filter is responding to the coarse tuning signal for preventing the bandpass filter from locking to a false signal.

2. The bandpass filter as recited in claim 1 wherein the means for producing comprises:
   (a) means for overcoupling the applied R.F. signal to the input port of the YIG filter producing the first R.F. signal; and (b) means for coupling the first R.F. signal from the YIG filter to the phase detector.

3. The bandpass filter as recited in claim 1 wherein the means for producing comprises means for coupling a portion of the signal out of the YIG filter for producing the first R.F. signal.

4. A method of operating a bandpass filter comprising the steps of:
   (a) overcoupling an applied R.F. signal having a frequency to a Yttrium Iron Garnet (YIG) filter so that at least a portion of the applied R.F. signal is reflected from the YIG filter to produce a first signal indicative of a center frequency of a passband of the YIG filter;
   (b) forming a fine tuning signal from the first signal and the applied R.F. signal, the fine tuning signal having an amplitude indicative of the magnitude of the difference between the frequency of the applied R.F. signal and the center frequency of the passband of the YIG filter and having a polarity indicative of a direction in which the center frequency of the passband is to be changed to make the center frequency coincident with the frequency of the applied R.F. signal; and
   (c) applying the fine tuning signal to the YIG filter for keeping the center frequency of the passband of the YIG filter coincident with the frequency of the applied R.F. signal.

5. The method of claim 4 additionally comprising the step of: disconnecting the fine tuning signal from the YIG filter wherever the YIG filter is responding to a coarse tuning signal.

6. A bandpass filter comprising:
   (a) a Yttrium Iron Garnet (YIG) filter, responsive to a tuning signal, having a passband with a center frequency and used in a reflection mode including means for producing a first radio frequency (R.F.) signal indicative of the center frequency of the passband of the YIG filter;
   (b) a discriminator, responsive to the first R.F. signal and an applied R.F. signal, comprising:
      (i) a 90° phase shifter having an input port and an output port;
      (ii) means for coupling a portion of the applied R.F. signal to the input port of the 90° phase shifter;
      (iii) a circulator having a first, a second and a third port, the first port fed by the applied R.F. signal and the second port connected to the input port of the YIG filter; and
      (iv) a phase detector having a first and second input port and an output port, the first input port fed by signals from the output port of the 90° phase shifter, the second input port fed by signals from the third port of the circulator and the output port being the output port of the discriminator; and
   (c) means, responsive to a signal from the output port of the discriminator, for providing the tuning signal to the YIG filter.

7. The bandpass filter as recited in claim 6 wherein the providing means comprises:
   (a) an amplifier having an input and an output, the input fed by the signal from the output port of the discriminator;
   (b) a shaping filter having an input and an output, the input fed by a signal from the output of the amplifier; and
   (c) a voltage-to-current converter having an input and an output, the input fed by a signal from the output of the shaping filter and the output providing the fine tuning signal to the YIG filter.

8. The bandpass filter as recited in claim 6 further comprising means for preventing the tuning signal from controlling the YIG filter whenever the YIG filter is responding to a coarse tuning signal.

9. The bandpass filer as recited in claim 8 wherein the preventing means comprises a switch between the output of the discriminator and the input of the providing means.

* * * * *